(12) United States Patent
Dunne

(10) Patent No.: US 6,379,870 B1
(45) Date of Patent: Apr. 30, 2002

(54) METHOD FOR DETERMINING SIDE WALL OXIDATION OF LOW-K MATERIALS

(75) Inventor: Jude A. Dunne, Menlo Park, CA (US)

(73) Assignee: Honeywell International Inc., Morristown, NJ (US)

( * ) Notice: Subject to any disclaimer, the term of this patent is extended or adjusted under 35 U.S.C. 154(b) by 54 days.

(21) Appl. No.: 09/614,633

(22) Filed: Jul. 12, 2000

(51) Int. Cl.[7] ................................................. G03F 7/00
(52) U.S. Cl. ..................... 430/314; 430/30; 430/311; 430/313; 430/317; 430/329; 430/331
(58) Field of Search .......................... 430/30, 311, 313, 430/314, 317, 329, 331

(56) References Cited

U.S. PATENT DOCUMENTS

| | | | | |
|---|---|---|---|---|
| 4,988,877 A | * | 1/1991 | Stokowksi et al. | 250/358.1 |
| 5,371,047 A | | 12/1994 | Greco et al. | 437/238 |
| 5,413,963 A | * | 5/1995 | Yen et al. | 437/195 |
| 5,759,273 A | * | 6/1998 | Martini et al. | 118/407 |
| 5,851,925 A | * | 12/1998 | Beh et al. | 438/708 |
| 5,883,014 A | | 3/1999 | Chen et al. | 438/782 |
| 6,074,941 A | | 6/2000 | Hsieh et al. | 438/624 |
| 6,207,583 B1 | * | 3/2001 | Dunne et al. | 438/725 |

FOREIGN PATENT DOCUMENTS

JP  59-39044  * 3/1984

* cited by examiner

*Primary Examiner*—Mark F. Huff
*Assistant Examiner*—Nicole Barreca
(74) *Attorney, Agent, or Firm*—Roberts & Mercanti, LLP

(57) ABSTRACT

The invention provides a process for monitoring the quality of via or trench formation in the production of a semiconductor device. More particularly, the invention pertains to a process for detecting side wall oxidation of low dielectric constant materials during the formation of vias or trenches in dielectrics. At least one via and/or trench is cleaved and contacted with a solvent to remove partially oxidized portions of dielectrics on the side walls, enabling defects to be visually inspected.

29 Claims, 2 Drawing Sheets

METHOD FOR DETERMINING SIDE WALL OXIDATION OF LOW-K MATERIALS

BACKGROUND OF THE INVENTION

1. Field of the Invention

The present invention relates to a process for monitoring the quality of via or trench formation in the production of a semiconductor device. More particularly, the invention pertains to a process for detecting side wall oxidation of low dielectric constant materials during the formation of vias and/or trenches in dielectrics.

2. Description of the Related Art

It is common in the art of manufacturing semiconductors to form semiconductors comprising a low dielectric constant (low-k) material on a silicon based wafer substrate. The most commonly used low-k dielectrics are silicates, siloxanes, silsesquioxanes, and organic polymers, such as polyimides. Conventional manufacturing processes for semiconductors generally use known spin-on-glass (SOG) application techniques to deposit the dielectric material onto the substrate.

After the dielectric material is deposited onto substrate, it is typical to form vias or trenches in the dielectric material using etching techniques that are well known in the art. During these etching processes, it is not uncommon for a small amount of exposed low dielectric constant dielectric material on the via or trench side walls to be damaged due to unavoidable oxidation or erosion. This damage along the side walls of the vias and/or trenches will adversely affect the electrical properties of the semiconductor because it will increase via resistance and result in poor connections with metallic interconnects. This damage may also result in higher dielectric constants and interfere with the overall performance of the semiconductor.

U.S. Pat. No. 6,074,941 teaches a method for forming vias using a plasma etchant with a fixed ratio of hydrogen and another to gas treat an exposed SOG layer. Structures formed using SOG methods have been known to outgas or poison the vias or trenches during processing steps. The outgassing causes defects to form within the vias or trenches, often at the side walls. Such defects may lead to higher and varying resistances and lower product yields. In U.S. Pat. No. 5,883,014, a hydrogen plasma treatment is performed on via side walls in the production of inter-metal dielectric layers to prevent damage to the side walls from out-gassing. This treatment avoids the deleterious affects of damage to the vias, such as decreased electrical potential, and superior electrical properties are maintained. U.S. Pat. No. 5,371,047 discloses an integrated circuit in which a composite dielectric layer is formed comprising an organic dielectric material, such as a polyimide, and an etch resistant layer on the organic layer. The etch resistant layer protects the organic layer from defects resulting either from patterning of the organic layer through reactive ion etching, the etching of a metal pattern over the organic layer, or from damage due to metal polishing processes. Avoiding such damage to dielectric materials is essential in forming semiconductors having good performance.

The importance of avoiding damage to low dielectric constant materials to produce semiconductors having good performance is well known in the art. To combat this problem, it is first necessary to identify and quantify any damage arising during manufacturing. However, because of the microscopic size of the vias and trenches, presently known techniques have had difficulty in detecting faults on the side walls. For example, surface probing techniques such as secondary ion mass spectroscopy (SIMS), x-ray photoelectron spectroscopy (XPS) and thin film Fourier transform infrared spectroscopy (FTIR) do not have signal intensity capabilities or small enough spot size to analyze the side walls of vias or trenches. Other known damage detecting techniques include experiments done on blanket films exposing the dielectric surface to a flux of ions or radicals perpendicular to the surface. However, these techniques are ineffective to inspect side walls that are parallel to the flux, and do not give an accurate indication of the extent of side wall damage. Therefore, it is difficult for manufacturers of semiconductor devices to assess whether certain etching or ashing techniques are compatible with low-k materials, hindering their integration into devices.

The present invention provides a process by which such side wall defects can be inspected to allow manufacturers to determine whether improved etching or ashing techniques are necessary. In particular, after etching vias in a sample of low-k materials and stripping or ashing off any photoresist, the sample is then cleaved for cross-sectional analysis. This cleaved surface is then immersed into a solvent for a time sufficient to remove partially oxidized low-k material. The cross-section is then analyzed by scanning electron microscopy and a simple visual inspection of the cross sectioned via or trench will show the extent or depth of the damage. This process allows manufacturers to determine whether certain etching and/or ashing processes will damage low-k materials and determine the depth and extent of oxidation in vias and in trenches, and allow production of semiconductor products having a better performance.

SUMMARY OF THE INVENTION

The invention provides a process for determining the quality of side walls of vias and/or trenches formed through a dielectric coating comprising the steps of:
  a) forming a dielectric coating on a substrate;
  b) depositing a photoresist onto the dielectric coating;
  c) imagewise patterning and developing the photoresist;
  d) etching the dielectric coating to form a pattern of vias and/or trenches in the dielectric coating;
  e) removing the remaining photoresist;
  f) cleaving the substrate across at least one of the vias and/or trenches;
  g) contacting the substrate with a solvent to thereby remove partially oxidized portions of the dielectric coating on side walls of the vias and/or trenches; and
  h) inspecting the side walls of the vias and/or trenches for defects.

The invention also provides a process for determining the quality of side walls of vias and/or trenches formed through a dielectric coating comprising the steps of:
  a) providing a dielectric coating on a substrate, which dielectric coating has vias and/or trenches formed therethrough;
  b) cleaving the substrate across at least one of the vias and/or trenches;
  c) contacting the substrate with a solvent to thereby remove partially oxidized portions of the dielectric coating on side walls of the vias and/or trenches; and
  d) inspecting the side walls of the vias and/or trenches for defects.

DETAILED DESCRIPTION OF THE PREFERRED EMBODIMENTS

The invention provides a process for determining the quality of side walls of vias and/or trenches formed through a dielectric coating.

Figure 1:
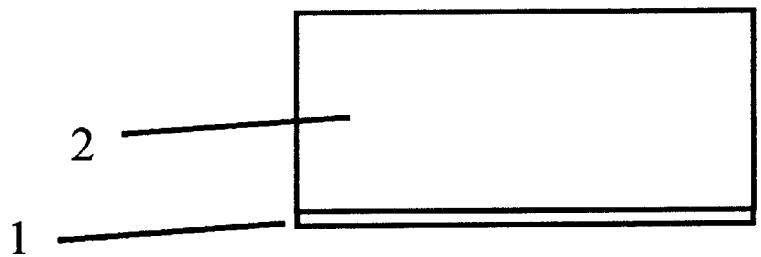
FIG. 1 is a schematic representation of a substrate coated with a low dielectric constant material.

The first step in conducting the process of the present invention is to form a layer of a dielectric composition 2 on a suitable substrate 1, as seen in FIG. 1. Typical substrates are those suitable to be processed into an integrated circuit or other microelectronic device. Suitable substrates for the present invention non-exclusively include semiconductor materials such as gallium arsenide (GaAs), silicon and compositions containing silicon such as crystalline silicon, polysilicon, amorphous silicon, epitaxial silicon, and silicon dioxide ($SiO_2$) and mixtures thereof.

The dielectric layer may be applied using any conventional method of deposition such as spin-coating, chemical vapor deposition, dip coating, spraying, or meniscus coating methods which are well-known in the art. Of these, spin coating and chemical vapor deposition are most preferred.

In the preferred embodiment of this invention, the dielectric material is a low dielectric constant material containing silicon. Preferably, the dielectric constant of the material is less than or equal to about 3, most preferably the dielectric constant is less than three. Suitable dielectric coatings comprise a polymer having a structure selected from the group consisting of $[H—SiO_{1.5}]_n[R—SiO_{1.5}]_m$, $[H_{0.5}—SiO_{1.5-1.8}]_n[R_{0.5-1.0}—SiO_{1.5-1.8}]_m$, $[H_{0-1.0}—SiO_{1.5}]_n[R—SiO_{1.5}]_m$, or $[H—SiO_{1.5}]_x[R—SiO_{1.5}]_y[SiO_2]_z$, wherein the sum of n and m, or the sum or x, y and z is from about 8 to about 5000, and m and y are selected such that carbon containing substituents are present in an amount of less than about 40 Mole percent. Also suitable polymers are those having a structure selected from the group consisting of $[HSiO_{1.5}]_n[RSiO_{1.5}]_m$, $[H_{0.5-1.0}SiO_{1.5-1.8}]_n[R_{0.5-1.0}SiO_{1.5-1.8}]_m$, or $[H_{0-1.0}SiO_{1.5-2.0}]_n[RSiO_{1.5}]_m$, wherein the sum of n and m is from about 8 to about 5000 and m is selected such that the carbon containing substituent is present in an amount of from about 40 Mole percent or greater; and $[HSiO_{1.5}]_x [RSiO_{1.5}]_y[RSiO_2]_z$; wherein the sum of x, y and z is from about 8 to about 5000 and y is selected such that the carbon containing substituent is present in an amount of about 40 Mole % or greater; and wherein R, is selected from substituted and unsubstituted straight chain and branched alkyl groups, cycloalkyl groups, substituted and unsubstituted aryl groups, and mixtures thereof.

Also preferred are dielectric materials selected from the group consisting of silanes, silsesquioxanes and siloxanes. These include those polymers having a formula selected from the group consisting of $[(HSiO_{1.5})_xO_y]_n$, $(HSiO_{1.5})_n$, $[(HSiO_{1.5})_xO_y(RSiO_{1.5})_z]_n$, $[(HSiO_{1.5})_x(RSiO_{1.5})_y]_n$ and $[(HSiO_{1.5})_xO_y(RSiO_{1.5})_z]_n$ wherein x=about 6 to about 20, y=1 to about 3, z=about 6 to about 20, n=1 to about 4,000, and each R is independently H, $C_1$ to $C_8$ alkyl or $C_6$ to $C_{12}$ aryl.

Preferred dielectric materials also include polymers such as hydrogensiloxane, hydrogensilsesquioxane, hydrogenmethylsiloxane, hydrogenethylsiloxane, hydrogenpropylsiloxane, hydrogenbutylsiloxane, hydrogentert-butylsiloxane, hydrogenphenylsiloxane, hydrogenmethylsilsesquioxane, hydrogenethylsilsesquioxane, hydrogenpropylsilsesquioxane, hydrogenbutylsilsesquioxane, hydrogentert-butylsilsesquioxane and hydrogenphenylsilsesquioxane.

Nanoporous silicas can also be employed. Techniques for preparing nanoporous silicas are well known in the art, for example as may be seen in U.S. Pat. No. 6,037,275, which is incorporated herein by reference.

The polymer is dispersed in a suitable compatible solvent, applied onto the substrate surface under ambient conditions and baked. Suitable solvent compositions include those which have a boiling point of about 120° C. or less, preferably about 100° C. or less. Suitable high volatility solvent composition nonexclusively include methanol, ethanol, n-propanol, isopropanol, n-butanol and mixtures thereof Other relatively high volatility solvent compositions which are compatible with the other ingredients can be readily determined by those skilled in the art The solvent is preferably present in an amount of from about 10% to about 90% by weight of the overall blend, more preferably from about 15% to about 80% and most preferably from about 40% to about 60% by weight of the overall blend with the polymer.

The thickness of the dielectric film on the substrate may vary depending on the amount of liquid dielectric that is applied to the substrate, but typically the thickness may range from about 500 Å to about 50,000 Å, and preferably from about 2000 Å to about 12000 Å. The amount of dielectric liquid applied to the substrate may vary from about 1 ml to about 10 ml, and preferably from about 2 ml to about 8 ml. In the preferred embodiment, the liquid material is spun onto the upper surface the substrate according to known spin techniques. Preferably, the dielectric is applied from a solution which is centrally applied to the substrate and then spun on a rotating wheel at speeds ranging between about 500 and about 6000 rpm, preferably from about 1500 to about 4000 rpm, for about 5 to about 60 seconds, preferably from about 10 to about 30 seconds, in order to spread the solution evenly across the substrate surface. The dielectric layer preferably has a density of from about 0.1 $g/cm^3$ to about 3 $g/cm^3$.

The dielectric coating may be dried by baking at temperatures of from about 150° C. to about 350° C. for example, for at least one minute. Drying may be conducted at a sequentially increasing temperature, for example I minute at 150° C., followed by one minute at 250° C. and one minute at 350° C. Suitable drying temperatures and heating times may be easily determined by those skilled in the art. Thereafter the coating may optionally be cured, such as by heating at temperatures of from about 250° C. to about 800° C. until cured. Suitable curing temperatures and heating times may be easily determined by those skilled in the art.

Figure 2:
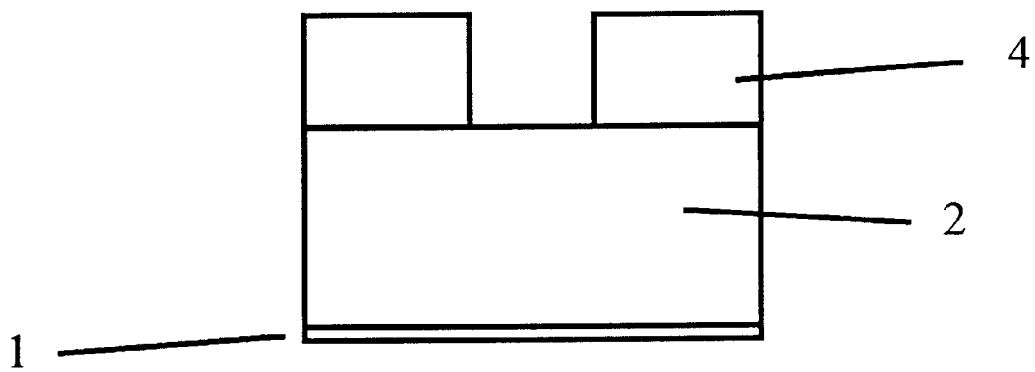
FIG. 2 is a schematic representation of a coated substrate after application, imagewise exposure and development of a photoresist on the dielectric material.

After the dielectric deposition, the next step is to form vias and/or trenches in the dielectric material. The vias and/or trenches are formed in the dielectric layer by well known photolithographic techniques using a photoresist composition. As seen in FIG. 2, this photoresist 4 is applied directly onto the dielectric layer. The photoresist composition may be positive working or negative working and are generally commercially available. Suitable positive working photoresists are well known in the art and may comprise an o-quinone diazide radiation sensitizer. The o-quinone diazide sensitizers include the o-quinone-4-or-5-sulfonyldiazides disclosed in U.S. Pat. Nos. 2,797,213; 3,106,465; 3,148,983; 3,130,047; 3,201,329; 3,785,825; and 3,802,885. When o-quinone diazides are used, preferred binding resins include a water insoluble, aqueous alkaline soluble or swellable binding resin, which is preferably a novolak. Suitable positive photodielectric resins may be obtained commercially, for example, under the trade name of AZ-P4620 from Clariant Corporation of Somerville, N.J. as well as Shipley I-line photoresist. Negative photoresists are also widely commercially available.

The photoresist is then imagewise exposed to actinic radiation such as light in the visible, ultraviolet or infrared regions of the spectrum through a mask, or scanned by an electron beam, ion or neutron beam or X-ray radiation. Actinic radiation may be in the form of incoherent light or coherent light, for example, light from a laser. The photoresist is then imagewise developed using a suitable solvent, such as an aqueous alkaline solution. Optionally the photoresist is heated to cure the image portions thereof and thereafter developed to remove the non-image portions and define a via mask.

Figure 3:
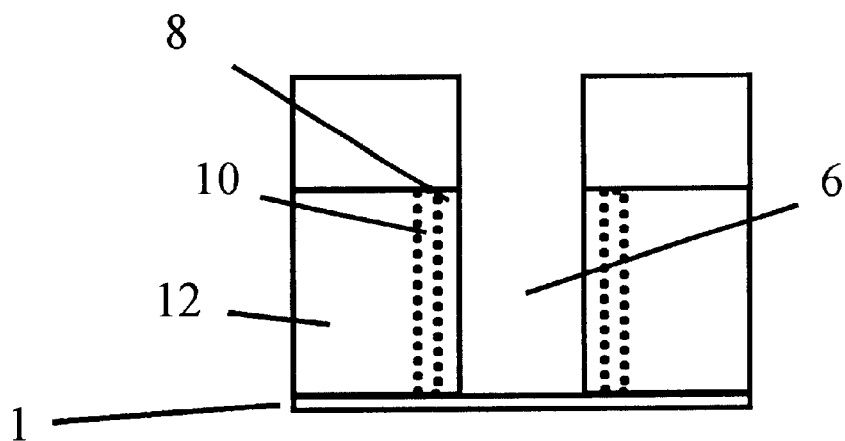
FIG. 3 is a schematic representation of a coated substrate having either a via or a trench etched into the dielectric material.

Subsequently, following the imaged pattern of the photoresist 4, the underlying dielectric material 2 is etched by etching techniques which are well known in the art, forming a pattern of vias and/or trenches 6 in the dielectric layer, as shown in FIG. 3. For example, this can be done by first generating ions in an etch chamber. Plasma ions may be generated in a plasma generator tool from a gas comprising one or more fluorine compound containing etchant gases.

Figure 4:
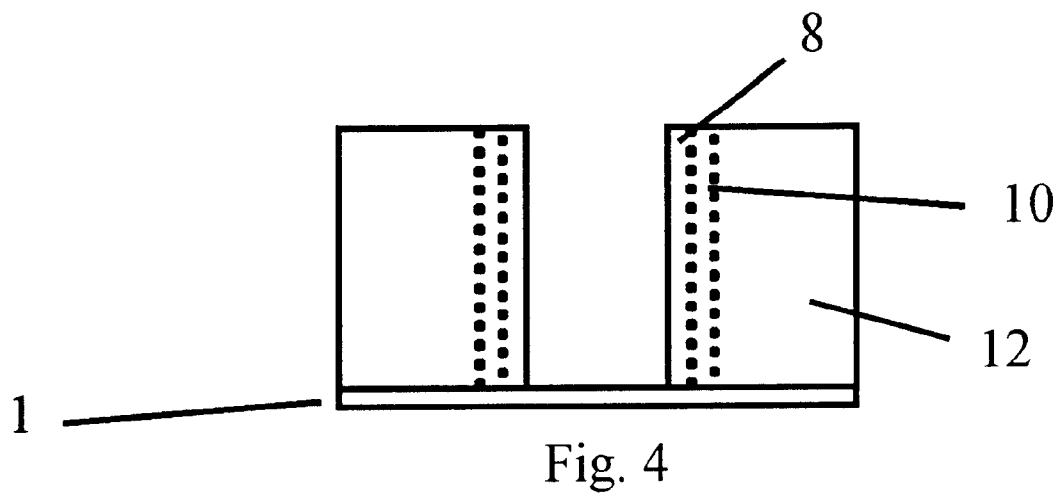
FIG. 4 is a schematic representation of a coated substrate, having either a via or a trench, after removal of the remaining photoresist.

After the vias and/or trenches are etched through the dielectric layer, the photoresist is then substantially completely removed from the dielectric surface either by stripping with a suitable solvent or by ashing by well known ashing techniques. Preferably, the plasma is generated in a microwave plasma generator located upstream of a stripping chamber and the stripping gases pass through this generator so that reactive species produced from the gases in the plasma enter the stripping chamber. Plasma ions are removed such as by filtering from the plasma radicals. The term "radical", as used herein is intended to define uncharged particles such as atoms or molecular fragments which are generated by the upstream plasma generator. The upstream plasma generator may comprise any plasma generator wherein the gases used to form the plasma are flowed into a separator chamber, or separate portion of the main etch chamber, wherein radicals formed in the plasma from the gases then flow into the main etch chamber while electrons and other charged particles, i.e., ionized portions of the etch gases, do not flow into the etch chamber, for example, by losing their charge by contact with the grounded walls, or by being repelled by a screen across the plasma flow path. Upstream plasma generators which are capable of providing a source of radicals, substantially without ions or electrons, are described, for example, in U.S. Pat. No. 5,174,856 and U.S. Pat. No. 5,200,031, the disclosures of which are hereby incorporated by reference. While any type of conventionally generated plasma may, in general, be used in the practice of the invention, preferably the plasma used is generated by a microwave plasma generator such as, for example, a Model AURA plasma generator commercially available from the GaSonics of San Jose, Calif, which is located upstream of a subsequent stripping or ashing chamber. Another upstream plasma generator which is capable of supplying a source of radicals in the substantial absence of electrons and/or ions is commercially available from Applied Materials, Inc. as an Advanced Strip Passivation (ASP) Chamber. This can be seen in FIG. 4. Downstream plasma ashers are commercially available from Mattson Technology of Fremont, Calif. Other downstream ashers include a model L3510 available from GaSonics in San Jose, California. Ashing may also be performed in an anisotropic method through the use of in situ ashing in an etch chamber such as a TEL DRM 85, available from Tokyo Electron Ltd.

During via and/or trench formation, and removal of the photoresist, it is typical for portions of the via and/or trench side walls to become either fully or partially oxidized by exposure to etchants or other applied chemicals. This can also be seen in FIGS. 3 and 4. As seen in the figures, an oxidation gradient may be generally formed at the side wall portions of the vias and/or trenches, wherein the portion of dielectric material closest to the via or trench is fully oxidized dielectric material 8. Further from the via or trench is partially oxidized dielectric material 10, as well as any non-oxidized dielectric material 12. This oxidation damage adversely affects the performance of the dielectric material by increasing the dielectric constant of the material. To remedy this problem it is important to first determine the extent of the damage caused by the processing techniques employed, and then adjust the processes accordingly.

The process of this invention accomplishes this by first cleaving the substrate across at least one of the vias and/or trenches. Next, the substrate is contacted with a suitable solvent to thereby remove any partially oxidized portions of the dielectric coating on side walls of the vias and/or trenches. In practice, the substrate is preferably immersed in the solvent for about 20 to about 90 minutes, more preferably for about 30 to about 60 minutes. The solvent is preferably maintained at a temperature of from about 25° C. to about 90° C., more preferably at about 40° C. to about 90° C. In the preferred embodiment of the invention, this solvent comprises hydroxylamine, hydrogen fluoride or combinations thereof Of these, the most preferred solvent is hydroxylamine.

Figure 5:
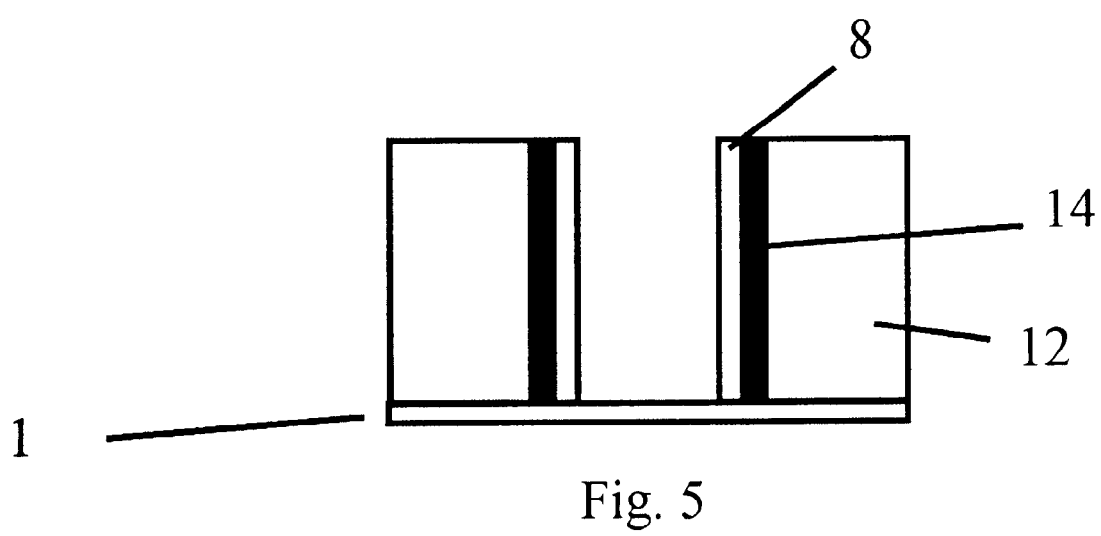
FIG. 5 is a schematic representation of a cross section of either a via or a trench after removal of partially oxidized portions of the dielectric coating on side walls of the vias and/or trenches after contact with a solvent.

Once this solvent removes these partially oxidized portions, the substrate may be visually inspected for defects. In particular, after these partially oxidized portions are removed, the area from which they were removed will appear to be stained black when inspected under a scanning electron microscope (SEM). This can be seen in FIG. 5 which is a schematic representation of a cleaved substrate under an SEM having a stained area 14 with the partially oxidized portions removed. This staining will enable the extent of the damage to be readily determined, such as by measuring the depth of removed side wall dielectric material with an appropriate ruler, or through other standard measuring techniques. This allows the quality of side walls of vias and/or trenches formed through a dielectric coating to be easily inspected and maintained at a good standard of performance. If after inspection it is determined that the defects are unacceptable, it may then be necessary to improve manufacturing techniques. This process assists manufacturers in making that determination.

The following non-limiting example serves to illustrate the invention.

EXAMPLE

A dielectric stack of material was formed on a 200 mm diameter silicon substrate. The stack comprises 7100 Å of high organic silicon polymer (HOSP™), commercially available from Honeywell International Inc., spin coated onto the Si substrate. 2000 Å of a tetraethoxyorthosilane (TEOS) based $SiO_2$ dielectric material was deposited by CVD process on the HOSP™ material.

Experimental Conditions

HOSP™ Spin conditions: HOSP™ was coated on a SEMIX TR8132-C coater with automatic dynamic dispensing, edge bead rinse (EBR) and back side rinse (BSR). The coater conditions are given in Table 1. The spin recipe for HOSP™ is given in Table 2.

TABLE 1

Spin Coater conditions

| Cup Exhaust | 30 mm/$H_2O$ | Forced Cup Exhaust | 38 mm/$H_2O$ |
|---|---|---|---|
| Cup Rinse Flow Rate (Part 1) | 70 cc/min | Cup Rinse Pressure (Part 1) | 2.0 kgf/$cm^2$ |
| BSR Flow Rate (Part 1) | 35 cc/min | BSR Pressure (Part 1) | 2.0 kgf/$cm^2$ |
| EBR Flow Rate (Part 1) | 70 cc/min | EBR Pressure (Part 1) | 2.0 kgf/$cm^2$ |
| 4kA HOSP ™ Flow Rate (Part 1) | 1.3 cc/min | 4kA HOSP ™ Pressure (Part 1) | 0.41 kgf/$cm^2$ |

TABLE 2

Spin Recipe for HOSP ™

| Step | Sequence | Time (sec.) | Spin (rpm) |
|---|---|---|---|
| 1 | Predispense | 0.2 | 250 |
| 2 | Dispense | 3.0 | 250 |
| 3 | Spread | 0.3 | 250 |
| 4 | Main Spin | 8.0 | 2300 |
| 5 | EBR | 3.0 | 1200 |
| 6 | EBR | 2.0 | 1200 |
| 7 | Cup Rinse | 2.0 | 1500 |
| 8 | Cup Rinse | 4.0 | 2200 |
| 9 | BSR | 8.0 | 1000 |
| 10 | Dry | 2.0 | 2200 |
| 11 | Spin Dry | 7.0 | 2800 |

Negative resist developer (NRD) is utilized as the rinse solvent.

Bake Conditions: All wafers were baked on the SEMIX TR8132-C coater following the spin step. The bake conditions for HOSP™ is given in Table 3. The Cool Plate refers to the pre-bake conditions and the Post Bake Plate refers to the Post-bake conditions.

TABLE 3

Bake Plate Conditions for HOSP ™

| Sequence | Temperature (° C.) | Time (sec) | $N_2$ (L/min) | Exhaust (mm/$H_2O$) |
|---|---|---|---|---|
| Cool Plate | 20 | 20 | N/A | N/A |
| Hot Plate 1 | 150 | 60 | 6 | 5 |
| Hot Plate 2 | 200 | 60 | 6 | 5 |
| Hot Plate 3 | 350 | 60 | 6 | 5 |
| Post Bake | R.T. | 40 | N/A | N/A |

Cure Conditions: The cure was conducted in a Thermco horizontal furnace. The curing sequence for HOSP™ is listed in Table 4.

TABLE 4

Cure Recipe for HOSP ™

| Cure Step # | Cure Step | Temperature (° C.) | Nitrogen Flow Rate (L/min) | Time (min) |
|---|---|---|---|---|
| 1 | Load wafers | 270 | 67 | 15 |
| 2 | Ramp (rate) | To 400 | 67 | 5.0° C./min |
| 3 | Dwell | 400 | 67 | 60 |
| 4 | Ramp (rate) | To 270 | 67 | — |
| 5 | Dwell | 270 | 67 | 15 |

Film Thickness and Uniformity: Film thickness measurements for the wafers were conducted on a Tencor SM300. All thickness measurements are the average of 49 points. The post bake and post Cure results for typical wafers are in Table 5.

TABLE 5

Metrology Results

| Wafer ID | Bake Thickness | Sigma [%] | Cure Thickness | Sigma [%] |
|---|---|---|---|---|
| TEL-1 | 7037 Å | 0.59 | 7370 Å | 0.56 |
| TEL-2 | 7050 Å | 0.60 | 7383 Å | 0.59 |

CVD TEOS Deposition:

Wafers were then sent to Process Specialties, Tracy, Calif. for CVD PETEOS oxide deposition. The oxide was deposited at 380° C. to a thickness of 2000 A +/−3% (film uniformity <2%).

Lithography

Patterning of a trench mask was also performed on these same wafers after oxide deposition. A trench pattern called T.6.0 was used to pattern 1 um thick I-line positive resist type. The mask is a set of trenches of varying width and pitch to a minimum feature size of 0.35 um.

Trench Etch

After patterning of trench patterns, these wafers were subjected to trench etch development. These wafers were etched in a TEL 85 DRM etch tool in a two step process. The first step involved etching the oxide material with standard oxide etch chemistries. The second etch step was optimized to yield straight side walls for HOSP™ trenches. This etch step resulted in a 30% over etch.

This etch recipe resulted in the following statistics:

| | 0.35 um Center | 0.35 um Edge | 0.5 um Center | 0.5 um Edge | 1.0 um Center | 1.0 um Edge |
|---|---|---|---|---|---|---|
| HOSP ™ Etch Rate | 5500 Å/min | 6250 Å/min | 6000 Å/min | 6250 Å/min | 6250 Å/min | 6000 Å/min |
| Taper Angle | 89.0 deg. | 89.4 deg. | 89.0 deg. | 89.0 deg. | 88.5 deg. | 88.9 deg. |
| Si Loss | 312.5 Å | 125 Å | 62.5 Å | 125 Å | 187.5 Å | 187.5 Å |

Trench Ash and Stain

After etch the films were ashed. Ashing was conducted in a downstream isotropic ashing tool. Films were ashed using three types of ashing chemistry:

| Chemistry | Temperature (° C.) | Over-Ash (%) |
|---|---|---|
| $O_2$ | 250 | 50 |
| $O_2/CF_4$ | 10 | 50 |
| $N_2/H_2$ | 250 | 50 |

Wafers were then cleaved at right angles to the direction of the trenches. Samples small enough for placement into a Scanning Electron Microscope were created (approx. 20 mm×10 mm) and placed in a heated beaker of hydroxylamine type solution at 80° C. for 30 minutes. The hydroxyl amine solution used is commercially available as ACT 935 from Ashland Chemical Company, Easton, Pa. The samples were then placed in an SEM and micrographs were taken of the features. After inspection of the micrographs, it is determined that the $O_2$ plasma causes worst damage to Low-k material. $O_2/CF_4$ produces less damage but still shows side wall damage. $N_2/H_2$ produces the least damage.

While the present invention has been particularly shown and described with reference to preferred embodiments, it will be readily appreciated by those of ordinary skill in the art that various changes and modifications may be made without departing from the spirit and scope of the invention. It is intended that the claims be to be interpreted to cover the disclosed embodiment, those alternatives which have been discussed above and all equivalents thereto.

What is claimed is:

1. A process for determining the quality of side walls of vias and/or trenches formed through a dielectric coating comprising the steps of:
   a) forming a dielectric coating on a substrate;
   b) depositing a photoresist onto the dielectric coating;
   c) imagewise patterning and developing the photoresist;
   d) etching the dielectric coating to form a pattern of vias and/or trenches in the dielectric coating;
   e) removing the remaining photoresist;
   f) cleaving the substrate across at least one of the vias and/or trenches;
   g) contacting the substrate with a solvent to thereby remove partially oxidized portions of the dielectric coating on side walls of the vias and/or trenches; and
   h) inspecting the side walls of the vias and/or trenches for defects.

2. The process of claim 1 wherein the dielectric coating comprises silicon.

3. The process of claim 1 wherein the dielectric coating comprises coating comprises a polymer having a structure selected from the group consisting of $[H-SiO_{1.5}]_n[R-SiO_{1.5}]_m$, $[H_{0.5}-SiO_{1.5-1.8}]_n[R_{0.5-1.0}-SiO_{1.5-1.8}]_m$, $[H_{0-1.0}-SiO_{1.5}]_n[R-SiO_{1.5}]_m$, $[R-SiO_{1.5}]_x[R-SiO_{1.5}]_y[SiO_2]_z$, wherein the sum of n and m, or the sum of x, y and z is from about 8 to about 5000, and m and y are selected such that carbon containing substituents are present in an amount of less than about 40 Mole percent, and wherein R is selected from substituted and unsubstituted straight chain and branched alkyl groups, cycloalkyl groups, substituted and unsubstituted aryl groups, and mixtures thereof.

4. The process of claim 1 wherein the dielectric coating comprises a polymer having a structure selected from the group consisting of $[HSiO_{1.5}]_n[RSiO_{1.5}]_m$, $[H_{0.5-1.0}SiO_{1.5-1.8}]_n[R_{0.5-1.0}SiO_{1.5-1.8}]_m$, $[H_{0-1.0}SiO_{1.5-2.0}]_n[RSiO_{1.5}]_m$, wherein the sum of n and m is from about 8 to about 5000 and m is selected such that the carbon containing substituent is present in an amount of from about 40 Mole percent or greater and $[HSiO_{1.5}]_x[RSiO_{1.5}]_y[SiO_2]_z$;

wherein the sum of x, y and z is from about 8 to about 5000 and y is selected such that the carbon containing substituent is present in an amount of about 40 Mole % or greater; and wherein R, is selected from substituted and unsubstituted straight chain and branched alkyl groups, cycloalkyl groups, substituted and unsubstituted aryl groups, and mixtures thereof.

5. The process of claim 1 wherein the dielectric coating comprises a material selected from the group consisting of silanes, silsesquioxanes and siloxanes.

6. The process of claim 1 wherein the dielectric coating comprises at least one polymer having a formula selected from the group consisting of $[(HSiO_{1.5})_xO_y]_n(HSiO_{1.5})_n$, $[(HSiO_{1.5})_xO_y(RSiO_{1.5})_z]_n$, $[(HSiO_{1.5})_x(RSiO_{1.5})_y]_n$ and $[(HSiO_{1.5})_xO_y(RSiO_{1.5})_z]_n$ wherein x=about 6 to about 20, y=1 to about 3, z=about 6 to about 20, n=1 to about 4,000, and each R is independently H, $C_1$ to $C_8$ alkyl or $C_6$ to $C_{12}$ aryl.

7. The process of claim 1 wherein the dielectric coating comprises at least one polymer selected from the group consisting of hydrogensiloxane, hydrogensilsesquioxane, hydrogenmethylsiloxane, hydrogenethylsiloxane, hydrogenpropylsiloxane, hydrogenbutylsiloxane, hydrogentert-butylsiloxane, hydrogenphenylsiloxane, hydrogenmethylsilsesquioxane, hydrogenethylsilsesquioxane, hydrogenpropylsilsesquioxane, hydrogenbutylsilsesquioxane, hydrogentert-butylsilsesquioxane and hydrogenphenylsilsesquioxane.

8. The process of claim 1 wherein the dielectric comprises a material having a dielectric constant of $\leq 3$.

9. The process of claim 1 wherein the dielectric comprises a nanoporous silica.

10. The process of claim 1 wherein step (e) is done by ashing the photoresist.

11. The process of claim 1 wherein step (e) is done by stripping the photoresist with a liquid solvent.

12. The process of claim 1 wherein the solvent comprises hydroxylamine, hydrogen fluoride and combinations thereof.

13. The process of claim 1 wherein the substrate is immersed in the solvent for about 20 to about 90 minutes.

14. The process of claim 1 wherein the solvent is maintained at a temperature of from about 25° C. to about 90° C.

15. The process of claim 1 wherein the inspecting is conducted by scanning electron microscopy.

16. The process of claim 1 wherein the substrate comprises a semiconductor.

17. The process of claim 1 wherein the substrate comprises gallium arsenide, silicon, compositions containing silicon and combinations thereof.

18. A process for determining the quality of side walls of vias and/or trenches formed through a dielectric coating comprising the steps of:
   a) providing a dielectric coating on a substrate, which dielectric coating has vias and/or trenches formed therethrough;
   b) cleaving the substrate across at least one of the vias and/or trenches;
   c) contacting the substrate with a solvent to thereby remove partially oxidized portions of the dielectric coating on side walls of the vias and/or trenches; and
   d) inspecting the side walls of the vias and/or trenches for defects.

19. The process of claim 18 wherein the dielectric coating comprises silicon.

20. The process of claim 18 wherein the dielectric coating comprises a polymer having a structure selected from the group consisting of $[\text{H}-\text{SiO}_{1.5}]_n[\text{R}-\text{SiO}_{1.5}]_m$, $[\text{H}_{0.5}-\text{SiO}_{1.5-1.8}]_n[\text{R}_{0.5-1.0}-\text{SiO}_{1.5-1.8}]_m$, $[\text{H}_{0-1.0}-\text{SiO}_{1.5}]_n[\text{R}-\text{SiO}_{1.5}]_m$, $[\text{H}-\text{SiO}_{1.5}]_x[\text{R}-\text{SiO}_{1.5}]_y[\text{SiO}_2]_z$, wherein the sum of n and m, or the sum of x, y and z is from about 8 to about 5000, and m and y are selected such that carbon containing substituents are present in an amount or less than about 40 Mole percent, and wherein R is selected from substituted and unsubstituted straight chain and branched alkyl groups, cycloalkyl groups, substituted and unsubstituted aryl groups, and mixtures thereof.

21. The process of claim 18 wherein the dielectric coating comprises a polymer having a structure selected from the group consisting of $[\text{HSiO}_{1.5}]_n[\text{RSiO}_{1.5}]_m$, $[\text{H}_{0.5-1.0}\text{SiO}_{1.5-1.8}]_n[\text{R}_{0.5-1.0}\text{SiO}_{1.5-1.8}]_m$, $[\text{H}_{0-1.0}\text{SiO}_{1.5-2.0}]_n[\text{RSiO}_{1.5}]_m$, wherein the sum of n and m is from about 8 to about 5000 and m is selected such that the carbon containing substituent is present in an amount of from about 40 Mole percent or greater; and $[\text{HSiO}_{1.5}]_x[\text{RSiO}_{1.5}]_y[\text{SiO}_2]_z$;

wherein the sum of x, y and z is from about 8 to about 5000 and y is selected such that the carbon containing substituent is present in an amount of about 40 Mole % or greater; and wherein R, is selected from substituted and unsubstituted straight chain and branched alkyl groups, cycloalkyl groups, substituted and unsubstituted aryl groups, and mixtures thereof.

22. The process of claim 18 wherein the dielectric coating comprises a material selected from the group consisting of silanes, silsesquioxanes and siloxanes.

23. The process of claim 18 wherein the dielectric coating comprises at least one polymer having a formula selected from the group consisting of $[(\text{HSiO}_{1.5})_x\text{O}_y]_n,(\text{HSiO}_{1.5})_n$, $[(\text{HSiO}_{1.5})_x\text{O}_y(\text{RSiO}_{1.5})_z]_n$, $[(\text{HSiO}_{1.5})_x(\text{RSiO}_{1.5})_y]_n$ and $[(\text{HSiO}_{1.5})_x\text{O}_y(\text{RSiO}_{1.5})_z]_n$.

wherein x=about 6 to about 20, y=1 to about 3, z=about 6 to about 20, n=1 to about 4,000, and each R is independently H, $C_1$, to $C_8$ alkyl or $C_6$ to $C_{12}$ aryl.

24. The process of claim 18 wherein the dielectric coating comprises at least one polymer selected from the group consisting of hydrogensiloxane, hydrogensilsesquioxane, hydrogenmethylsiloxane, hydrogenethylsiloxane, hydrogenpropylsiloxane, hydrogenbutylsiloxane, hydrogentert-butylsiloxane, hydrogenphenylsiloxane, hydrogenmethylsilsesquioxane, hydrogenethylsilsesquioxane, hydrogenpropylsilsesquioxane, hydrogenbutylsilsesquioxane, hydrogentert-butylsilsesquioxane and hydrogenphenylsilsesquioxane.

25. The process of claim 18 wherein the dielectric comprises a material having a dielectric constant of $\leq 3$.

26. The process of claim 18 wherein the solvent comprises hydroxylamine, hydrogen fluoride and combinations thereof.

27. The process of claim 18 wherein the inspecting is conducted by scanning electron microscopy.

28. The process of claim 18 wherein the substrate comprises a semiconductor.

29. The process of claim 18 wherein the substrate comprises gallium arsenide, silicon, compositions containing silicon and combinations thereof.

* * * * *